US009025317B2

(12) United States Patent  (10) Patent No.: US 9,025,317 B2
Richardson et al.  (45) Date of Patent: May 5, 2015

(54) MULTI-MATERIAL PROTECTIVE CASE FOR SLIDING/ARTICULATING/ROTATING HANDHELD ELECTRONIC DEVICES

(75) Inventors: Curtis Richardson, Fort Collins, CO (US); John Loudenslager, Phoenix, AZ (US); Jamie Johnson, Fort Collins, CO (US); Stephen Willes, Fort Collins, CO (US); Travis Smith, Fort Collins, CO (US); Alan Morine, Fort Collins, CO (US); Matthew Glanzer, Fort Collins, CO (US); Jane Michie, Wellington, CO (US); Cameron Magness, Fort Collins, CO (US)

(73) Assignee: Otter Products, LLC, Fort Collins, CO (US)

( * ) Notice: Subject to any disclaimer, the term of this patent is extended or adjusted under 35 U.S.C. 154(b) by 106 days.

(21) Appl. No.: 13/050,791

(22) Filed: Mar. 17, 2011

(65) Prior Publication Data

US 2011/0228458 A1   Sep. 22, 2011

Related U.S. Application Data

(60) Provisional application No. 61/314,954, filed on Mar. 17, 2010, provisional application No. 61/317,537, filed on Mar. 25, 2010.

(51) Int. Cl.
*H05K 5/02* (2006.01)
*H04M 1/18* (2006.01)
*H04M 1/02* (2006.01)

(52) U.S. Cl.
CPC ........... *H04M 1/0252* (2013.01); *H05K 5/0217* (2013.01); *H04M 1/185* (2013.01)

(58) Field of Classification Search
CPC . H05K 5/0217; H04M 1/0202; H04M 1/0252
USPC ..................... 361/679.01, 679; 206/305, 307, 206/308.1–308.3, 320, 701
See application file for complete search history.

(56) References Cited

U.S. PATENT DOCUMENTS

| 2,164,221 | A | 6/1939 | Raney et al. |
| 2,392,787 | A | 1/1946 | Vermot |
| 2,851,670 | A | 9/1958 | Robert |
| 3,023,885 | A | 3/1962 | Kindseth |
| 3,143,384 | A | 8/1964 | Robert, Jr. |
| 3,184,847 | A | 5/1965 | Leo |
| 3,482,895 | A | 12/1969 | Becklin |
| 3,521,216 | A | 7/1970 | Tolegian |

(Continued)

FOREIGN PATENT DOCUMENTS

| EP | 2129202 A2 * 12/2009 |
| JP | 2008018637   1/1996 |

(Continued)

*Primary Examiner* — Zachary M Pape
*Assistant Examiner* — Douglas Burtner

(57) ABSTRACT

A two-piece hard shell case with a silicone or other flexible component may protect devices that hinge, slide, or otherwise articulate. A front surface hard cover may snap or connect to the front of the device while a back surface hard cover may snap or connect to the back of the device. A flexible component may be held in place under one or both of the hard shell pieces. The flexible component may be held under one or both of the hard shell covers and may have button pushers, covers, or other features to allow a user to operate a protected device while still covering the device.

10 Claims, 13 Drawing Sheets

(56) References Cited

U.S. PATENT DOCUMENTS

| | | |
|---|---|---|
| 3,590,988 A | 7/1971 | Hollar |
| 3,665,991 A | 5/1972 | Gillemot et al. |
| 3,689,866 A | 9/1972 | Kelly |
| 3,832,725 A | 8/1974 | Cook |
| 4,097,878 A | 6/1978 | Cramer |
| 4,298,204 A | 11/1981 | Jinkins |
| 4,312,580 A | 1/1982 | Schwomma et al. |
| 4,335,930 A | 6/1982 | Feldman |
| 4,352,968 A | 10/1982 | Pounds |
| 4,375,323 A | 3/1983 | Inagaki et al. |
| 4,383,743 A | 5/1983 | Nozawa et al. |
| 4,418,830 A | 12/1983 | Dzung et al. |
| 4,420,078 A | 12/1983 | Belt et al. |
| 4,546,874 A | 10/1985 | Kirchhan |
| 4,584,718 A | 4/1986 | Fuller |
| 4,649,453 A | 3/1987 | Iwasawa |
| 4,658,956 A | 4/1987 | Takeda et al. |
| 4,683,587 A | 7/1987 | Silverman |
| 4,686,332 A | 8/1987 | Greanias et al. |
| 4,703,161 A | 10/1987 | McIean |
| 4,712,657 A | 12/1987 | Myers et al. |
| 4,733,776 A | 3/1988 | Ward |
| 4,762,227 A | 8/1988 | Patterson |
| 4,803,504 A | 2/1989 | Maeno et al. |
| 4,836,256 A | 6/1989 | Meliconi |
| 4,942,514 A | 7/1990 | Miyagaki et al. |
| 4,963,902 A | 10/1990 | Fukahori |
| 4,977,483 A | 12/1990 | Perretta |
| 4,994,829 A | 2/1991 | Tsukamoto |
| 5,002,184 A | 3/1991 | Lloyd |
| 5,025,921 A | 6/1991 | Gasparaitis et al. |
| 5,087,934 A | 2/1992 | Johnson |
| 5,092,458 A | 3/1992 | Yokoyama |
| 5,092,459 A | 3/1992 | Uljanic et al. |
| 5,123,044 A | 6/1992 | Tate |
| 5,175,873 A | 12/1992 | Goldenberg et al. |
| 5,177,515 A | 1/1993 | Tsukamoto |
| 5,219,067 A | 6/1993 | Lima et al. |
| 5,231,381 A | 7/1993 | Duwaer |
| 5,233,502 A | 8/1993 | Beatty et al. |
| 5,239,323 A | 8/1993 | Johnson |
| 5,239,324 A | 8/1993 | Ohmura et al. |
| 5,258,592 A | 11/1993 | Nishikawa et al. |
| 5,285,894 A | 2/1994 | Kamata et al. |
| 5,294,988 A | 3/1994 | Wakabayashi et al. |
| 5,305,032 A | 4/1994 | Arai |
| 5,336,896 A | 8/1994 | Katz |
| 5,360,108 A | 11/1994 | Alagia |
| 5,368,159 A | 11/1994 | Doria |
| 5,380,968 A | 1/1995 | Morse |
| 5,383,091 A | 1/1995 | Snell |
| 5,386,084 A | 1/1995 | Risko |
| 5,388,691 A | 2/1995 | White |
| 5,388,692 A | 2/1995 | Withrow et al. |
| 5,499,713 A | 3/1996 | Huffer |
| 5,505,328 A | 4/1996 | Stribiak |
| 5,508,479 A | 4/1996 | Schooley |
| 5,541,813 A | 7/1996 | Satoh et al. |
| 5,548,306 A | 8/1996 | Yates et al. |
| 5,573,164 A | 11/1996 | Law |
| 5,583,742 A | 12/1996 | Noda et al. |
| 5,584,054 A | 12/1996 | Tyneski et al. |
| 5,586,002 A | 12/1996 | Notarianni |
| 5,586,176 A | 12/1996 | Peck |
| 5,590,760 A | 1/1997 | Astarb |
| 5,610,655 A | 3/1997 | Wakabayashi et al. |
| 5,613,237 A | 3/1997 | Bent et al. |
| 5,632,373 A | 5/1997 | Kumar et al. |
| 5,636,101 A | 6/1997 | Bonsall et al. |
| 5,648,757 A | 7/1997 | Vernace et al. |
| 5,669,004 A | 9/1997 | Sellers |
| 5,681,122 A | 10/1997 | Burke |
| 5,707,757 A | 1/1998 | Lee |
| 5,713,048 A | 1/1998 | Hayakawa |
| 5,713,466 A | 2/1998 | Tajima |
| 5,845,803 A | 12/1998 | Saito et al. |
| 5,850,915 A | 12/1998 | Tajima |
| 5,889,730 A | 3/1999 | May |
| 5,907,721 A | 5/1999 | Schelling et al. |
| 5,946,501 A | 8/1999 | Hayakawa |
| 5,956,291 A | 9/1999 | Nehemiah et al. |
| 5,982,520 A | 11/1999 | Weiser et al. |
| 5,990,874 A | 11/1999 | Tsumura et al. |
| 6,031,524 A | 2/2000 | Kunert |
| 6,041,924 A | 3/2000 | Tajima |
| 6,049,813 A | 4/2000 | Danielson et al. |
| 6,068,119 A | 5/2000 | Derr et al. |
| 6,073,770 A | 6/2000 | Park |
| 6,082,535 A | 7/2000 | Mitchell |
| 6,092,707 A | 7/2000 | Bowes |
| 6,094,785 A | 8/2000 | Montgomery et al. |
| 6,128,441 A | 10/2000 | Kamata et al. |
| 6,132,367 A | 10/2000 | Adair |
| 6,201,867 B1 | 3/2001 | Koike |
| 6,215,474 B1 | 4/2001 | Shah |
| 6,239,968 B1 | 5/2001 | Kim et al. |
| 6,273,252 B1 | 8/2001 | Mitchell |
| 6,274,826 B1 | 8/2001 | Serizawa et al. |
| 6,301,100 B1 | 10/2001 | Iwata |
| 6,304,459 B1 | 10/2001 | Toyosato et al. |
| 6,305,656 B1 | 10/2001 | Wemyss |
| 6,311,017 B1 | 10/2001 | Mori |
| 6,313,892 B2 | 11/2001 | Gleckman |
| 6,313,982 B1 | 11/2001 | Hino |
| 6,317,313 B1 | 11/2001 | Mosgrove et al. |
| 6,349,824 B1 | 2/2002 | Yamada |
| 6,353,529 B1 * | 3/2002 | Cies ................. 361/679.05 |
| 6,375,009 B1 | 4/2002 | Lee |
| 6,388,877 B1 | 5/2002 | Canova, Jr. et al. |
| 6,396,769 B1 | 5/2002 | Polany |
| 6,415,138 B2 | 7/2002 | Sirola et al. |
| 6,445,577 B1 | 9/2002 | Madsen et al. |
| 6,456,487 B1 | 9/2002 | Hetterick |
| 6,471,056 B1 | 10/2002 | Tzeng |
| 6,519,141 B2 | 2/2003 | Tseng et al. |
| 6,525,928 B1 | 2/2003 | Madsen et al. |
| 6,532,152 B1 | 3/2003 | White et al. |
| 6,536,589 B2 | 3/2003 | Chang |
| 6,571,056 B1 | 5/2003 | Shimamura et al. |
| 6,574,434 B2 | 6/2003 | Matsuoto et al. |
| 6,594,472 B1 | 7/2003 | Curtis et al. |
| 6,595,608 B1 | 7/2003 | Minelli et al. |
| 6,597,865 B1 | 7/2003 | Negishi et al. |
| 6,614,423 B1 | 9/2003 | Wong et al. |
| 6,614,722 B2 | 9/2003 | Polany et al. |
| 6,616,111 B1 | 9/2003 | White |
| 6,617,973 B1 | 9/2003 | Osterman |
| 6,625,394 B2 | 9/2003 | Smith et al. |
| 6,626,362 B1 | 9/2003 | Steiner et al. |
| 6,634,494 B1 | 10/2003 | Derr et al. |
| 6,636,697 B2 | 10/2003 | Smith et al. |
| 6,646,864 B2 | 11/2003 | Richardson |
| 6,665,174 B1 | 12/2003 | Derr et al. |
| 6,667,738 B2 | 12/2003 | Murphy |
| 6,669,017 B2 | 12/2003 | Linihan |
| 6,698,608 B2 | 3/2004 | Parker et al. |
| 6,701,159 B1 | 3/2004 | Powell |
| 6,721,651 B1 | 4/2004 | Minelli |
| 6,731,913 B2 | 5/2004 | Humphreys et al. |
| 6,751,552 B1 | 6/2004 | Minelli |
| 6,760,570 B1 | 7/2004 | Higdon, Jr. |
| 6,772,899 B2 | 8/2004 | Delmon |
| 6,778,388 B1 | 8/2004 | Minelli |
| 6,781,825 B2 | 8/2004 | Shih et al. |
| 6,785,566 B1 | 8/2004 | Irizarry |
| 6,819,549 B1 | 11/2004 | Lammers-Meis et al. |
| 6,819,866 B2 | 11/2004 | Da Silva |
| 6,822,161 B2 | 11/2004 | Komatsu et al. |
| 6,822,640 B2 | 11/2004 | Derocher |
| 6,839,430 B2 | 1/2005 | Kwak |
| 6,844,845 B1 | 1/2005 | Whiteside et al. |
| 6,913,201 B1 | 7/2005 | Wagner et al. |
| 6,914,774 B1 | 7/2005 | Albertini et al. |
| 6,929,141 B1 | 8/2005 | Minghetti |

(56) References Cited

U.S. PATENT DOCUMENTS

| | | |
|---|---|---|
| 6,953,126 B2 | 10/2005 | Parker et al. |
| 6,954,405 B2 | 10/2005 | Polany et al. |
| 6,955,293 B1 | 10/2005 | Katsanevas |
| 6,962,454 B1 | 11/2005 | Costello |
| 6,971,517 B2 | 12/2005 | Chen |
| 6,975,888 B2 | 12/2005 | Buesseler et al. |
| 6,980,777 B2 | 12/2005 | Shepherd et al. |
| 6,983,130 B2 | 1/2006 | Chien et al. |
| 6,987,527 B2 | 1/2006 | Kossin |
| 6,992,659 B2 | 1/2006 | Gettemy |
| 6,995,976 B2 | 2/2006 | Richardson |
| D516,807 S | 3/2006 | Richardson et al. |
| 7,025,274 B2 | 4/2006 | Solomon et al. |
| 7,046,230 B2 | 5/2006 | Zadesky et al. |
| 7,050,712 B2 | 5/2006 | Shimamura |
| 7,050,841 B1 | 5/2006 | Onda |
| 7,054,441 B2 | 5/2006 | Pletikosa |
| 7,061,762 B2 | 6/2006 | Canova, Jr. et al. |
| 7,069,063 B2 | 6/2006 | Halkosaari et al. |
| 7,072,467 B2 | 7/2006 | Ono |
| 7,082,264 B2 | 7/2006 | Watanabe et al. |
| 7,085,542 B2 | 8/2006 | Dietrich et al. |
| 7,089,547 B2 | 8/2006 | Goodman et al. |
| 7,106,959 B2 | 9/2006 | Sato |
| D530,079 S | 10/2006 | Thomas et al. |
| 7,146,701 B2 | 12/2006 | Mahoney et al. |
| 7,158,376 B2 * | 1/2007 | Richardson et al. ..... 361/679.56 |
| 7,180,735 B2 | 2/2007 | Thomas et al. |
| 7,194,086 B2 | 3/2007 | Pletikosa |
| 7,194,202 B2 | 3/2007 | Funahashi et al. |
| 7,194,291 B2 | 3/2007 | Peng |
| 7,225,923 B2 | 6/2007 | Hallee et al. |
| 7,230,823 B2 | 6/2007 | Richardson et al. |
| 7,236,588 B2 | 6/2007 | Gartrell |
| 7,255,228 B2 | 8/2007 | Kim |
| 7,263,032 B2 | 8/2007 | Polany et al. |
| 7,290,654 B2 | 11/2007 | Hodges |
| 7,312,984 B2 | 12/2007 | Richardson et al. |
| 7,327,841 B2 | 2/2008 | Schreiber et al. |
| 7,341,144 B2 | 3/2008 | Tajiri et al. |
| 7,343,184 B2 | 3/2008 | Rostami |
| 7,352,961 B2 | 4/2008 | Watanabe et al. |
| 7,362,570 B2 | 4/2008 | Su |
| 7,365,281 B2 | 4/2008 | Yamaguchi et al. |
| 7,366,555 B2 | 4/2008 | Jokinen et al. |
| 7,369,881 B2 | 5/2008 | Tsujimoto |
| 7,389,869 B2 | 6/2008 | Mason |
| 7,400,917 B2 | 7/2008 | Wood et al. |
| D574,819 S | 8/2008 | Andre et al. |
| D575,056 S | 8/2008 | Tan |
| 7,409,148 B2 | 8/2008 | Takahashi et al. |
| 7,418,278 B2 | 8/2008 | Eriksson et al. |
| 7,428,427 B2 | 9/2008 | Brunstrom et al. |
| 7,436,653 B2 | 10/2008 | Yang et al. |
| D581,421 S | 11/2008 | Richardson et al. |
| 7,449,650 B2 | 11/2008 | Richardson et al. |
| D582,149 S | 12/2008 | Tan |
| 7,464,813 B2 | 12/2008 | Carnevali |
| 7,464,814 B2 | 12/2008 | Carnevali |
| 7,495,659 B2 | 2/2009 | Marriott et al. |
| 7,495,895 B2 | 2/2009 | Carnevali |
| D589,016 S | 3/2009 | Richardson et al. |
| 7,499,040 B2 | 3/2009 | Zadesky et al. |
| 7,502,550 B2 | 3/2009 | Ariga |
| 7,511,956 B2 | 3/2009 | Tomioka et al. |
| 7,525,792 B2 | 4/2009 | Yokote |
| 7,535,799 B2 | 5/2009 | Polany et al. |
| D593,319 S | 6/2009 | Richardson et al. |
| 7,540,844 B2 | 6/2009 | Muser |
| 7,555,325 B2 | 6/2009 | Goros |
| D597,089 S | 7/2009 | Khan et al. |
| 7,558,594 B2 | 7/2009 | Wilson |
| 7,594,576 B2 | 9/2009 | Chen et al. |
| 7,609,512 B2 | 10/2009 | Richardson et al. |
| D603,603 S | 11/2009 | Laine et al. |
| 7,613,386 B2 | 11/2009 | Shimamura |
| 7,623,898 B2 | 11/2009 | Holmberg |
| D606,751 S | 12/2009 | Andre et al. |
| 7,630,746 B2 | 12/2009 | Holmberg |
| 7,653,292 B2 | 1/2010 | Yamaguchi et al. |
| 7,663,878 B2 | 2/2010 | Swan et al. |
| 7,663,879 B2 | 2/2010 | Richardson et al. |
| 7,668,580 B2 | 2/2010 | Shin et al. |
| 7,679,674 B2 | 3/2010 | Nishizawa |
| 7,688,580 B2 | 3/2010 | Richardson et al. |
| 7,697,269 B2 | 4/2010 | Yang et al. |
| 7,711,400 B2 | 5/2010 | Nuovo |
| 7,733,642 B2 | 6/2010 | Liou et al. |
| D619,361 S | 7/2010 | Andre et al. |
| D620,000 S | 7/2010 | Bau |
| 7,755,975 B2 | 7/2010 | Pettersen et al. |
| D622,716 S | 8/2010 | Andre et al. |
| 7,772,507 B2 | 8/2010 | Orr et al. |
| 7,775,354 B2 | 8/2010 | Latchford et al. |
| 7,787,756 B2 | 8/2010 | Funahashi et al. |
| 7,789,228 B2 | 9/2010 | Zenzai |
| 7,789,696 B2 | 9/2010 | Umei et al. |
| 7,801,425 B2 | 9/2010 | Fantone et al. |
| 7,850,032 B2 | 12/2010 | Carnevali et al. |
| 7,854,434 B2 | 12/2010 | Heiman et al. |
| 7,889,489 B2 | 2/2011 | Richardson et al. |
| 7,907,394 B2 | 3/2011 | Johnson et al. |
| 7,926,818 B2 | 4/2011 | Isono |
| 7,933,122 B2 | 4/2011 | Richardson et al. |
| 7,936,566 B2 | 5/2011 | Shigyo et al. |
| 7,941,196 B2 | 5/2011 | Kawasaki et al. |
| 7,944,697 B2 | 5/2011 | Hata et al. |
| 7,975,870 B2 | 7/2011 | Laule et al. |
| 7,978,092 B2 | 7/2011 | Osaka |
| 7,988,468 B2 | 8/2011 | Yang et al. |
| 7,993,071 B2 | 8/2011 | Clawson |
| 8,014,134 B2 | 9/2011 | Liu et al. |
| 8,024,015 B2 | 9/2011 | Araki et al. |
| 8,031,472 B2 | 10/2011 | Bicket et al. |
| 8,032,194 B2 | 10/2011 | Liu et al. |
| 8,050,022 B2 | 11/2011 | Mcintyre |
| 8,053,668 B2 | 11/2011 | Lai et al. |
| 8,068,331 B2 | 11/2011 | Sauers et al. |
| 8,089,757 B2 | 1/2012 | Chen et al. |
| 8,101,859 B2 | 1/2012 | Zadesky |
| 8,138,434 B2 | 3/2012 | Tang et al. |
| 8,164,899 B2 | 4/2012 | Yamaguchi et al. |
| 8,167,126 B2 | 5/2012 | Stiehl |
| 8,191,706 B1 | 6/2012 | Liu |
| 8,204,561 B2 | 6/2012 | Mongan et al. |
| 8,223,997 B2 | 7/2012 | Wilson, II et al. |
| 8,245,842 B2 | 8/2012 | Bau |
| 8,251,210 B2 | 8/2012 | Schmidt et al. |
| 8,265,264 B2 | 9/2012 | Yamaguchi et al. |
| 8,269,104 B2 | 9/2012 | Choraku et al. |
| 8,286,789 B2 | 10/2012 | Wilson et al. |
| 8,295,043 B2 | 10/2012 | Tai et al. |
| 8,311,595 B2 | 11/2012 | Takatsuka et al. |
| 8,373,980 B2 | 2/2013 | Reber |
| 8,400,408 B2 | 3/2013 | Hotelling et al. |
| 8,430,240 B2 | 4/2013 | Kim |
| 8,454,101 B2 | 6/2013 | Kuo |
| 2001/0040109 A1 | 11/2001 | Yaski et al. |
| 2002/0009195 A1 | 1/2002 | Schon |
| 2002/0065054 A1 | 5/2002 | Humphreys et al. |
| 2002/0071550 A1 | 6/2002 | Pletikosa |
| 2002/0079244 A1 | 6/2002 | Kwong |
| 2002/0085342 A1 | 7/2002 | Chen et al. |
| 2002/0085709 A1 | 7/2002 | Hsu |
| 2002/0086702 A1 | 7/2002 | Lai et al. |
| 2002/0090212 A1 | 7/2002 | Shimamura et al. |
| 2002/0101707 A1 | 8/2002 | Canova et al. |
| 2002/0136557 A1 | 9/2002 | Shimamura |
| 2002/0137475 A1 | 9/2002 | Shou et al. |
| 2002/0175096 A1 | 11/2002 | Linihan |
| 2002/0195910 A1 | 12/2002 | Hus et al. |
| 2003/0080947 A1 | 5/2003 | Genest et al. |
| 2003/0103624 A1 | 6/2003 | Hu |
| 2003/0111366 A1 | 6/2003 | Enners |

(56) References Cited

U.S. PATENT DOCUMENTS

| | | |
|---|---|---|
| 2003/0128397 A1 | 7/2003 | Smith et al. |
| 2003/0151890 A1 | 8/2003 | Huang et al. |
| 2004/0014506 A1 | 1/2004 | Kemppinen |
| 2004/0121226 A1 | 6/2004 | Kaelin et al. |
| 2004/0195783 A1 | 10/2004 | Akagi et al. |
| 2004/0226836 A1 | 11/2004 | Schreiber et al. |
| 2005/0247584 A1 | 11/2005 | Lu |
| 2005/0279661 A1 | 12/2005 | Hodges |
| 2006/0255493 A1 | 11/2006 | Fouladpour |
| 2006/0274493 A1 | 12/2006 | Richardson et al. |
| 2006/0279924 A1 | 12/2006 | Richardson et al. |
| 2007/0071423 A1 | 3/2007 | Fantone et al. |
| 2007/0115387 A1 | 5/2007 | Ho |
| 2007/0138920 A1 | 6/2007 | Austin et al. |
| 2007/0146985 A1 | 6/2007 | Mick et al. |
| 2007/0158220 A1 | 7/2007 | Cleereman et al. |
| 2007/0215663 A1 | 9/2007 | Chongson et al. |
| 2007/0261978 A1 | 11/2007 | Sanderson |
| 2007/0280053 A1 | 12/2007 | Polany et al. |
| 2008/0039161 A1 | 2/2008 | Chan |
| 2008/0055258 A1 | 3/2008 | Sauers |
| 2008/0163463 A1 | 7/2008 | Hulden |
| 2008/0164267 A1 | 7/2008 | Huber |
| 2008/0316687 A1 | 12/2008 | Richardson et al. |
| 2009/0017884 A1 | 1/2009 | Rotschild |
| 2009/0080153 A1* | 3/2009 | Richardson et al. ..... 361/679.56 |
| 2009/0087655 A1 | 4/2009 | Yamada et al. |
| 2009/0111543 A1 | 4/2009 | Tai et al. |
| 2009/0113758 A1 | 5/2009 | Nishiwaki et al. |
| 2009/0260844 A1 | 10/2009 | Tseng |
| 2009/0283184 A1 | 11/2009 | Han |
| 2010/0053355 A1 | 3/2010 | Iwase et al. |
| 2010/0085691 A1 | 4/2010 | Yeh et al. |
| 2010/0093412 A1 | 4/2010 | Serra et al. |
| 2010/0096284 A1 | 4/2010 | Bau |
| 2010/0104814 A1 | 4/2010 | Richardson |
| 2010/0147737 A1 | 6/2010 | Richardson et al. |
| 2010/0203931 A1 | 8/2010 | Hynecek et al. |
| 2010/0238119 A1* | 9/2010 | Dubrovsky et al. ........... 345/169 |
| 2011/0002106 A1 | 1/2011 | Bentley et al. |
| 2011/0024315 A1 | 2/2011 | Kim |
| 2011/0073608 A1 | 3/2011 | Richardson et al. |
| 2011/0157055 A1 | 6/2011 | Tilley et al. |
| 2011/0157800 A1 | 6/2011 | Richardson et al. |
| 2012/0043235 A1 | 2/2012 | Klement |
| 2012/0099262 A1 | 4/2012 | Reber et al. |
| 2012/0099265 A1 | 4/2012 | Reber |
| 2012/0099266 A1 | 4/2012 | Reber et al. |
| 2012/0103844 A1 | 5/2012 | Piedra et al. |

FOREIGN PATENT DOCUMENTS

| | | |
|---|---|---|
| WO | 9400037 A | 1/1994 |
| WO | 9941958 A | 8/1999 |

* cited by examiner

MULTI-MATERIAL PROTECTIVE CASE FOR SLIDING/ARTICULATING/ROTATING HANDHELD ELECTRONIC DEVICES

BACKGROUND

Protective covers for handheld electronic devices, such as various types of MP3 players, video players, cell phones, smart phones, satellite phones, walkie talkies, GPS navigational devices, telematics devices, pagers, monitors, personal data assistants, bar code scanners, as well as various types of computers, including portable computers, laptop computers, handheld computers, ultra-mobile computers, tablet computers, and various hybrid devices that combine two or more of these functions, provide a valuable function in preventing damage to these handheld electronic devices. Various types of protective cases are available that provide a varying amount of protection.

SUMMARY

A two-piece hard shell case with a silicone or other flexible component may protect devices that hinge, slide, or otherwise articulate. A front surface hard cover may snap or connect to the front of the device while a back surface hard cover may snap or connect to the back of the device. A flexible component may be held in place under one or both of the hard shell pieces. The flexible component may be held under one or both of the hard shell covers and may have button pushers, covers, or other features to allow a user to operate a protected device while still covering the device.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Many electronic devices are constructed with two pieces that may be joined by hinges or various sliding mechanisms. Examples of such devices may be hand held mobile telephones, portable gaming devices, laptop computer, netbook computers, or other devices.

A protective cover or outer shell for these devices may be constructed with two hard shell components, one for the front portion of the electronic device and one for the rear portion. A silicone or other flexible component may be held by one or both of the hard shell components.

In some embodiments, the flexible component may be held by only one of the hard shell components. In an example of such an embodiment, the flexible component may be installed underneath the rear hard shell component.

In some embodiments, the flexible component may be held or retained by both hard shell components. In an example of such an embodiment, the flexible component may be retained by both hard shell components and the flexible component may have a portion that covers a hinge or other mechanism that may join the two portions of the electronic device.

The flexible component may have pads or other mechanisms that may allow a user to activate a button on the electronic device when the cover is installed. Some embodiments may have removable covers for earphone ports or other electrical connectors as well.

In some embodiments, the protective cover may be a removable cover that may be installed and removed by a consumer. In such embodiments, the protective cover may have logos, colors, or other designs that allow a user to personalize their electronic device. In such embodiments, the protective cover may have snaps or other engagement mechanisms that may be easily installed and removed by a consumer.

In other embodiments, the protective cover may not be a consumer installed cover. In such embodiments, the protective cover may be installed by the manufacturer of the electronic device and may be an integral part of the electronic device. In such embodiments, the protective cover may be installed using fasteners, adhesives, snaps, or other mechanisms for which a typical consumer may not have access or ability to install or remove.

Figure 1:
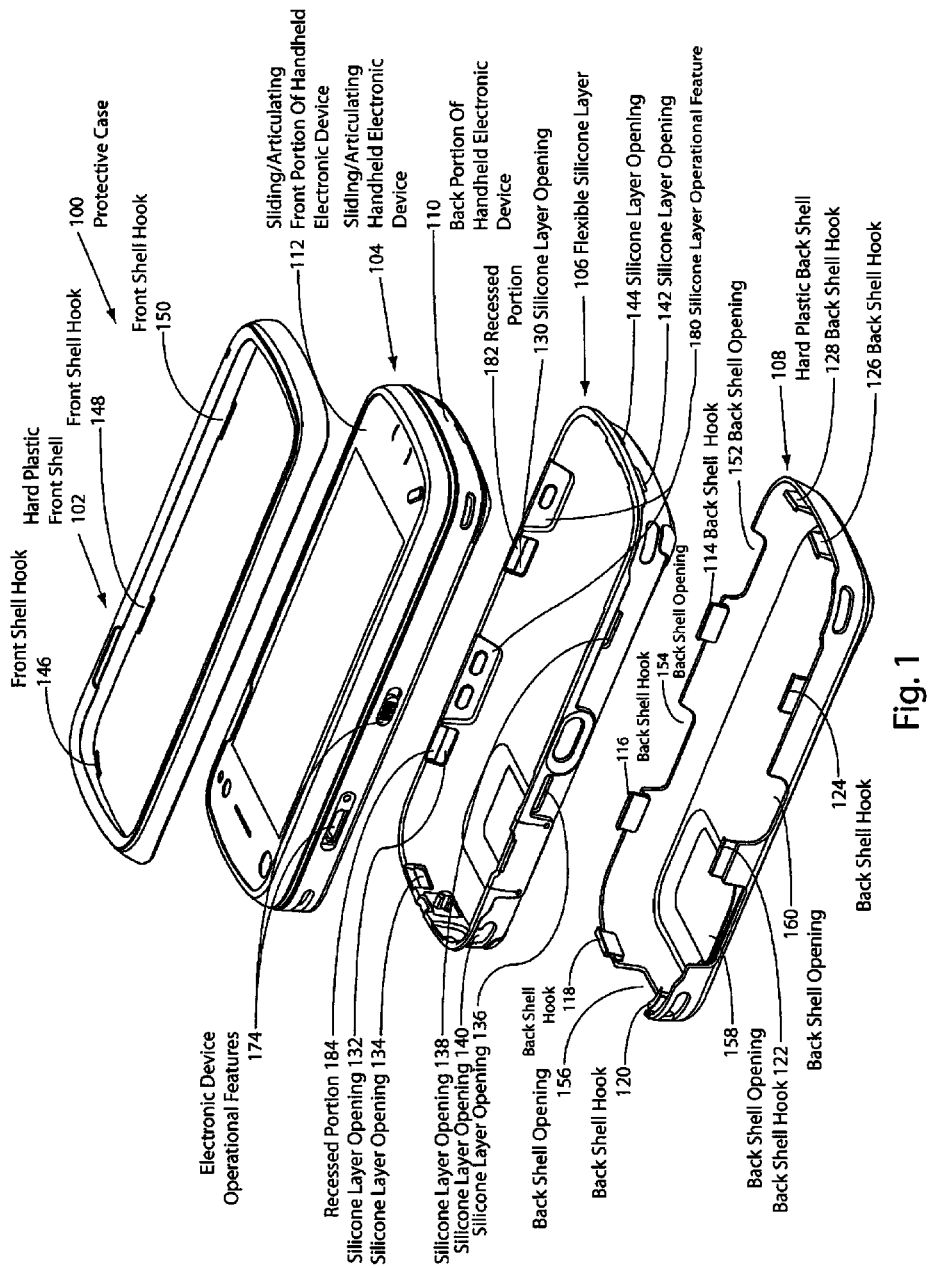
FIG. 1 is an exploded view of an embodiment of a protective case and a sliding/articulating handheld electronic device.

FIG. 1 is a perspective view of a protective case 100 and a sliding/articulating handheld electronic device 104. Many handheld electronic devices have a back portion 110 and a front sliding/articulating front portion 112. Mobile phones, for example, may have a sliding front portion that may include a screen that slides to an open position to access a keyboard. Other mobile phones may have a front portion, such as sliding/articulating front portion 112, that articulates on hinges to expose a keyboard.

In order to provide a cover for both the back portion 110 and the sliding/articulating front portion 112, separate hard plastic shells, such as hard plastic front shell 102 and hard plastic back shell 108, can be utilized. However, plastic shells that attach directly to front and back portions of handheld electronic devices often do not provide a large amount of protection, especially against shocks from impacts. In addition, hard plastic shells may provide openings to operational features of the handheld electronic device that further reduces the protection provided by hard plastic shells.

As illustrated in FIG. 1, the hard plastic front shell 102 has a series of hooks, such as front shell hooks 146, 148, 150, and other front shell hooks (not shown), on opposing sides of the hard plastic front shell 102, that attach the hard plastic front shell 102 to the sliding/articulating front portion 112 of the sliding/articulating handheld electronic device 104.

The hard plastic front shell 102 may be constructed from thermoplastic polymers and has a hardness generally in the range of 65 to 120 on the Rockwell scale for HDPE, acrylic, PP, PVC, ABS, nylon, 10% GF PC. A narrower range of 105-115 on the Rockwell scale can be used for ABS and PC. These ranges are exemplary only and may vary with specific materials. The thermoplastic polymers can be molded, die cast or otherwise formed to a desired shape. Other materials can also be used for the hard shell, including metals that can be formed or machined to a desired shape.

The hard plastic front shell 102 may attach directly to the sliding/articulating front portion 112 of the sliding/articulating handheld electronic device 104. The hard plastic front shell may allow the sliding/articulating front portion 112 to slide or articulate between an open and closed position without interfering with the sliding/articulating motion provided by a sliding/articulating connector (not shown). The hard plastic front shell 102 may provide impact protection and may have an elevated surface that may protect the sliding/articulating front portion of the sliding/articulating handheld electronic device 104 from impacts.

As also illustrated in FIG. 1, a hard plastic back shell 108 has a plurality of back shell hooks 114, 116, 118, 120, 122, 124, 126, 128 that attach the hard plastic back shell 108 to the back portion 110 of the sliding/articulating handheld electronic device 104. Again, the manner in which the back shell hooks 114-128 attach to the back portion 110 of the sliding/articulating handheld electronic device 104 may not impede the operation of the sliding/articulating front portion 112 of the sliding/articulating handheld electronic device 104.

The hard plastic back shell 108 also has a plurality of back shell openings 152, 154, 156, 158, 160 that are aligned with electronic device operational features 174, including buttons and ports, in the sliding/articulating handheld electronic device 104. The electronic device operational features 174 include the operational features illustrated in FIG. 1, as well as the device buttons 186, 188, illustrated in FIG. 4, and other operational features that may exist on the sliding/articulating handheld electronic device 104. The hard plastic back shell 108 can be made from the same materials as the hard plastic front shell 102 with the same range of hardness.

As also illustrated in FIG. 1, a flexible silicone layer 106 is provided that is disposed in the hard plastic back shell 108. The density of the flexible silicone layer ranges from 50 Shore A to 60 Shore A, but may vary from 30 to 70 Shore A. In one embodiment, a range of 48-52 Shore A is used.

The flexible silicone layer 106 is molded to fit directly into, and to conform closely to, the hard plastic back shell 108. The flexible silicone layer 106 has a plurality of silicone layer openings 130, 132, 134, 136, 138, 140, 142, 144. Each of these silicone layer openings 130-144 is aligned with back shell hooks 114-128, respectively.

Each of the back shell hooks 114-128 is recessed inwardly from the outer edge of the hard plastic back shell 108 so as to engage the silicone layer openings 130-144. The back shell hooks 114-128 are inserted through the silicone layer openings 130-144 from the outside of the flexible silicone layer 106 and extend inwardly to the interior portion of the flexible silicone layer 106. In this fashion, the back shell hooks 114-128 are disposed inside of the flexible silicone layer 106, adjacent recessed portions, such as recessed portions 182, 184 in flexible silicone layer 106, which allows the back shell hooks 114-128 to engage the back portion 110 of the sliding/articulating handheld electronic device 104.

By inserting the recessed back shell hooks 114-128 through silicone layer openings 130-144, the back shell hooks 114-128 are hidden by the flexible silicone layer 106 and a clean and decorative appearance is provided from the outside of the hard plastic back shell 108. Also, since the back shell hooks 114-128 are recessed inwardly and the flexible silicone layer 106 is recessed outwardly, next to silicone layer openings 130-144, such as recessed portions 182, 184, there is little or no deflection of the flexible silicone layer 106 resulting from insertion of the back shell hooks, which further assists the combination of the hard plastic back shell 108 and the flexible silicone layer 106, to function as a single integrated unit.

Upon assembly, the hard plastic back shell 108 and the flexible silicone layer 106 may be securely married together as a result of the mechanical connection between the recessed back shell hooks 114-128 and the silicone layer openings 130-144, since the back shell hooks 114-128 are inserted through silicone layer openings 130-144. In this manner, the flexible silicone layer 106 appears to be part of the hard plastic back shell 108 and functions as a single integrated unit. As a result, the flexible silicone layer 106 can be made from a soft, flexible material that is more easily capable of absorbing shocks since deformation and movement of the flexible silicone layer 106 away from the hard plastic back shell 108 is substantially restricted.

The back shell openings 152-160 are aligned with various portions of the flexible silicone layer 106, as disclosed in more detail below. As also shown in FIG. 1, silicone layer operational features 180 are disposed in the flexible silicone layer 106 that are disposed in the back shell openings 152-160 when the flexible silicone layer 106 is married to the hard plastic back shell 108. The silicone layer operational features 180 generically refer to the various pads, portals, access panels and other operational features of the flexible silicone layer 106.

Figure 2:
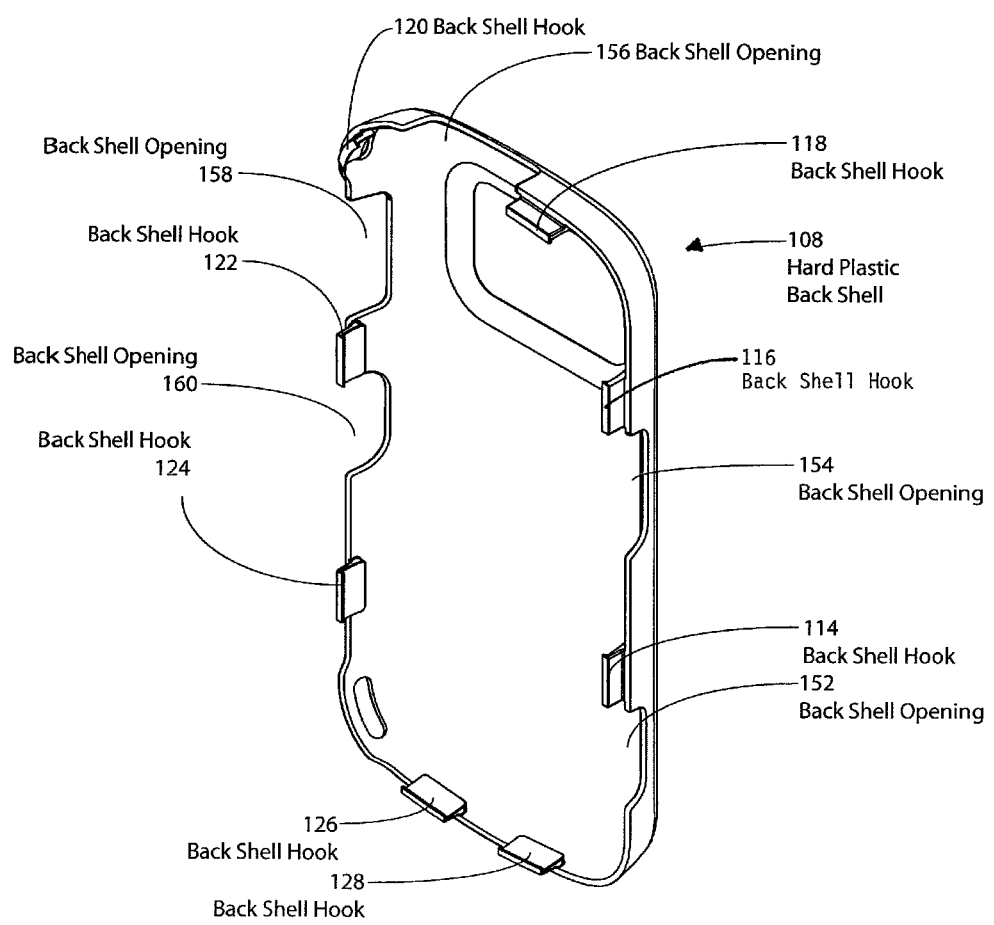
FIG. 2 is a perspective view of a hard plastic back shell of the embodiment of FIG. 1.

FIG. 2 is a schematic perspective view of the hard plastic back shell 108. As illustrated in FIG. 2, the hard plastic back shell 108 includes a plurality of back shell hooks 114-128 that are recessed from the outer surface of the hard plastic back shell 108. The back shell hooks 114-128 slide through the silicone layer openings 130-144 of flexible silicone layer 106 (FIG. 1) and are hidden by the flexible silicone layer 106. The silicone layer operational features 180 are disposed in the back shell openings 152-160, as disclosed in more detail below, to prevent the entry of dust, dirt and moisture.

Figure 3:
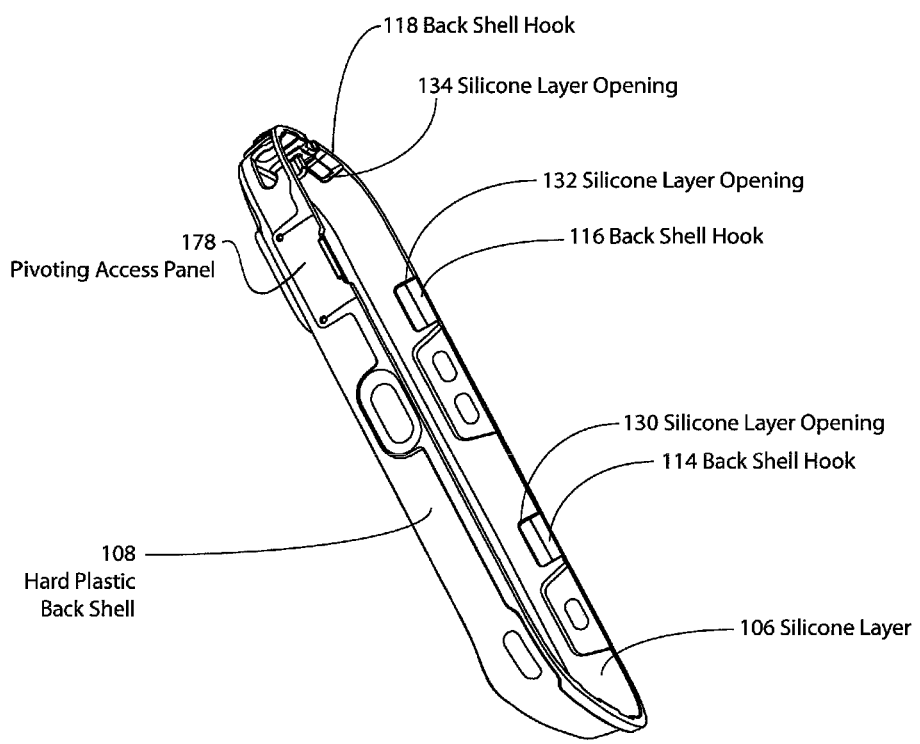
FIG. 3 is a perspective view of an assembled silicone layer and hard plastic back shell.

FIG. 3 is a schematic perspective view of the flexible silicone layer 106 disposed in the hard plastic back shell 108. As shown in FIG. 3, back shell hooks 114, 116, 118 are inserted through silicone layer openings 130, 132, 134 in the flexible silicone layer 106. Back shell hooks 114, 116, 118 are disposed on the interior portion of the flexible silicone layer 106 for attachment to the back portion 110 (FIG. 1) of the sliding/articulating handheld electronic device 104 (FIG. 1). Since the back shell hooks 114-118 are inserted through the silicone layer openings 130-134, back shell hooks 114-118 are not visible from the exterior of the hard plastic back shell 108.

For example, as illustrated in FIG. 3, back shell hooks 120, 122, 124, 126, 128 (FIGS. 1 and 2) are not visible since the flexible silicone layer 106 hides the back shell hooks 120-128, as illustrated in FIG. 3. In this manner, the flexible silicone layer 106 and hard plastic back shell 108 appear as a single integrated unit. Further, back shell hooks 114-128, when inserted through silicone layer openings 130-144, function to securely hold the flexible silicone layer 106 to the hard plastic back shell 108 so that the combined structure functions as a single integrated unit. FIG. 3 also includes a pivoting access panel 178, which provides access to a port on the back portion 110.

Figure 4:
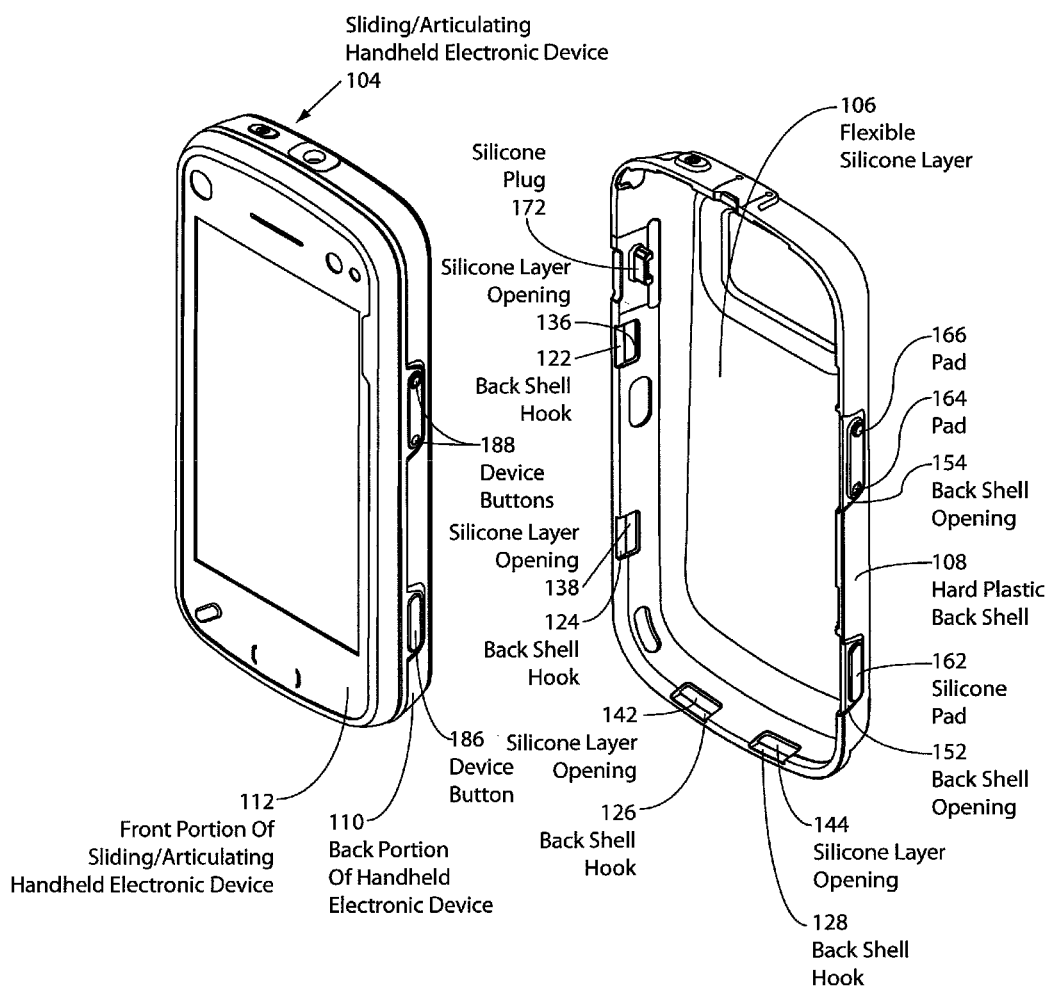
FIG. 4 is another perspective view of the assembled hard plastic back shell and silicone layer of the embodiment of FIG. 1, and the sliding/articulating handheld electronic device.

FIG. 4 is an exploded view of the sliding/articulating handheld electronic device 104 that is aligned with the flexible silicone layer 106, which is married to the hard plastic back shell 108. As shown in FIG. 4, silicone pad 162 is disposed in back shell opening 152. Similarly, silicone pads 164, 166 are disposed in the back shell opening 154. Silicone pads 162, 164, 166 comprise silicone layer operational features 180 (FIG. 1), as well as other operational features on the flexible silicone layer 106, such as device buttons 186, 188 that are disclosed in FIG. 1.

The silicone layer operational features 180 interact with electronic device operational features 174. Specifically, silicone pad 162 interacts with the device button 186, while silicone pads 164, 166 interact with device button 188. Another silicone layer operational feature 180 comprises the silicone plug 172 that is inserted in a jack (not shown) in the back portion 110 of the sliding/articulating handheld electronic device 104.

As also illustrated in FIG. 4, the back shell hook 122 extends through the silicone layer opening 136. Similarly, back shell hook 124 is inserted through the silicone layer opening 138. Back shell hook 126 is similarly inserted through silicone layer opening 142, while back shell hook 128 is inserted through silicone layer opening 144. Each of the back shell hooks 114-128 (FIGS. 1 and 4) attach to an inner surface of the back portion 110 of the sliding/articulating handheld electronic device 104 to securely hold the assembled flexible silicone layer 106 and hard plastic back shell 108 to the back portion 110 of the sliding/articulating handheld electronic device 104 without interfering with the sliding motion of the sliding/articulating front portion 112 (FIGS. 1 and 4) of the sliding/articulating handheld electronic device 104.

Figure 5:
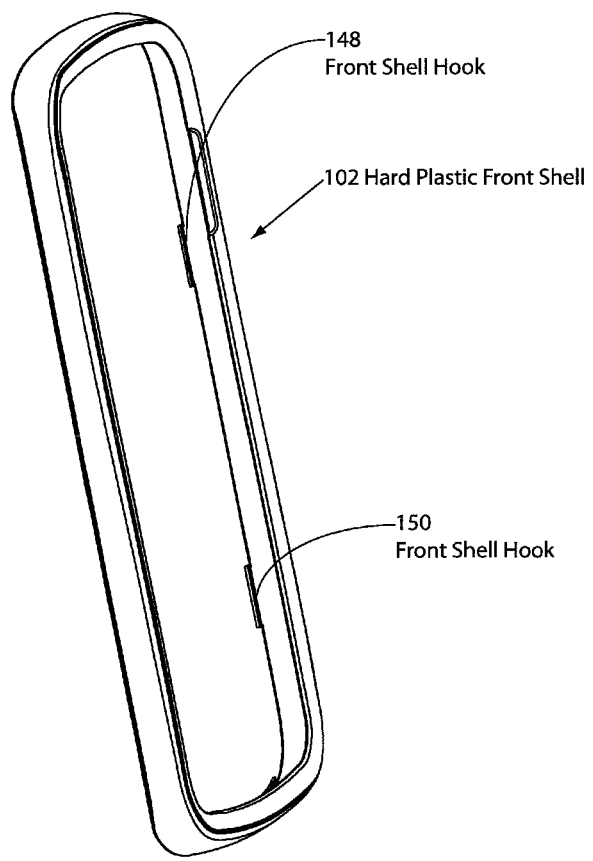
FIG. 5 is a perspective view of the hard plastic front shell of the embodiment of FIG. 1.

FIG. 5 is a schematic perspective view of the hard plastic front shell 102. As shown in FIG. 5, front shell hooks 148, 150, as well as other front shell hooks not illustrated in FIG. 5, securely attach to the sliding/articulating front portion 112 of the sliding/articulating handheld electronic device 104. The hard plastic front shell 102, as well as the front shell hooks, do not interfere with the sliding/articulating motion of the sliding/articulating front portion 112 of the sliding/articulating handheld electronic device 104.

Figure 6:
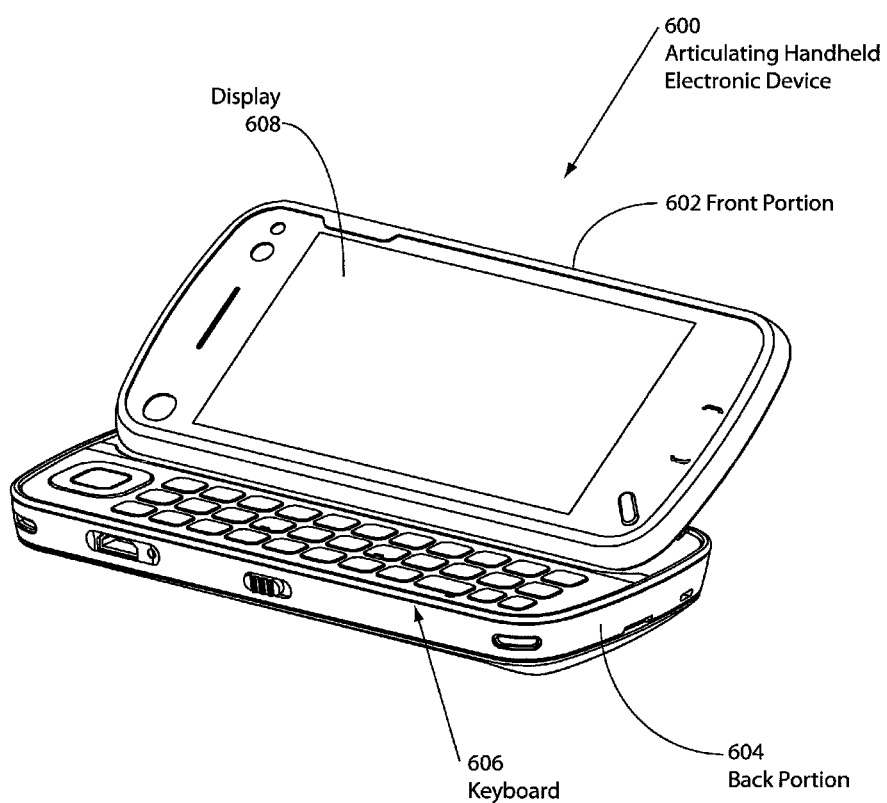
FIG. 6 is a perspective view of an embodiment of an articulating handheld electronic device.

FIG. 6 is a schematic perspective view of an articulating handheld electronic device 600. As shown in FIG. 6, the front portion 602 swivels away from the back portion 604 to expose a keyboard 606. The front portion, as illustrated in the embodiment of FIG. 6, includes a display 608 that is disposed at an angle to the back portion 604 and keyboard 606 to assist in viewing the information on display 608. The protective cover 100 (FIG. 1) is attached to the front portion 602 and back portion 604 in a manner that does not impede the articulating movement of the front portion 602.

Figure 7:
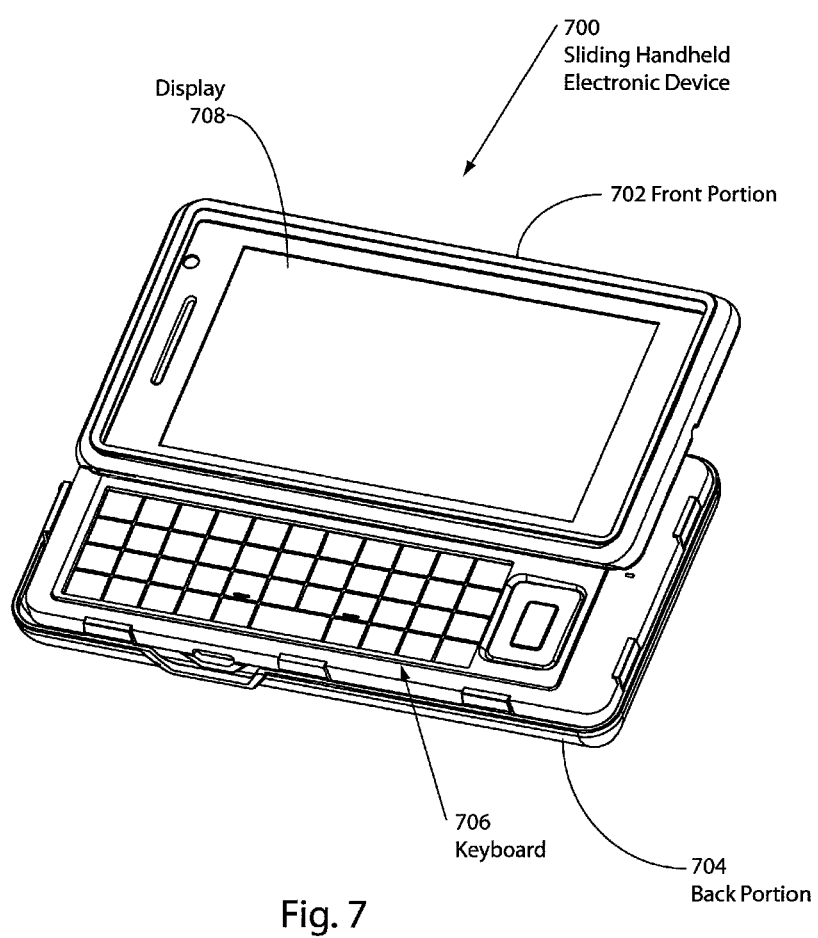
FIG. 7 is a perspective view of an embodiment of a sliding handheld electronic device.

FIG. 7 is a schematic perspective view of a sliding handheld electronic device 700. As shown in FIG. 7, a front portion 702 slides away from a back portion 704 to expose the keyboard 706. A hard plastic front shell, such as hard plastic front shell 102 (FIG. 1), attaches to the front portion 702 and does not interfere with the movement of the front portion 702 with regard to the back portion 704. Similarly, a hard plastic back shell and flexible silicone layer, such as hard plastic back shell 108 (FIG. 1) and flexible silicone layer 106 (FIG. 1), attach to the back portion 704 and do not interfere with the articulating movement of the front portion 702 of the sliding handheld electronic device 700.

Figure 8:
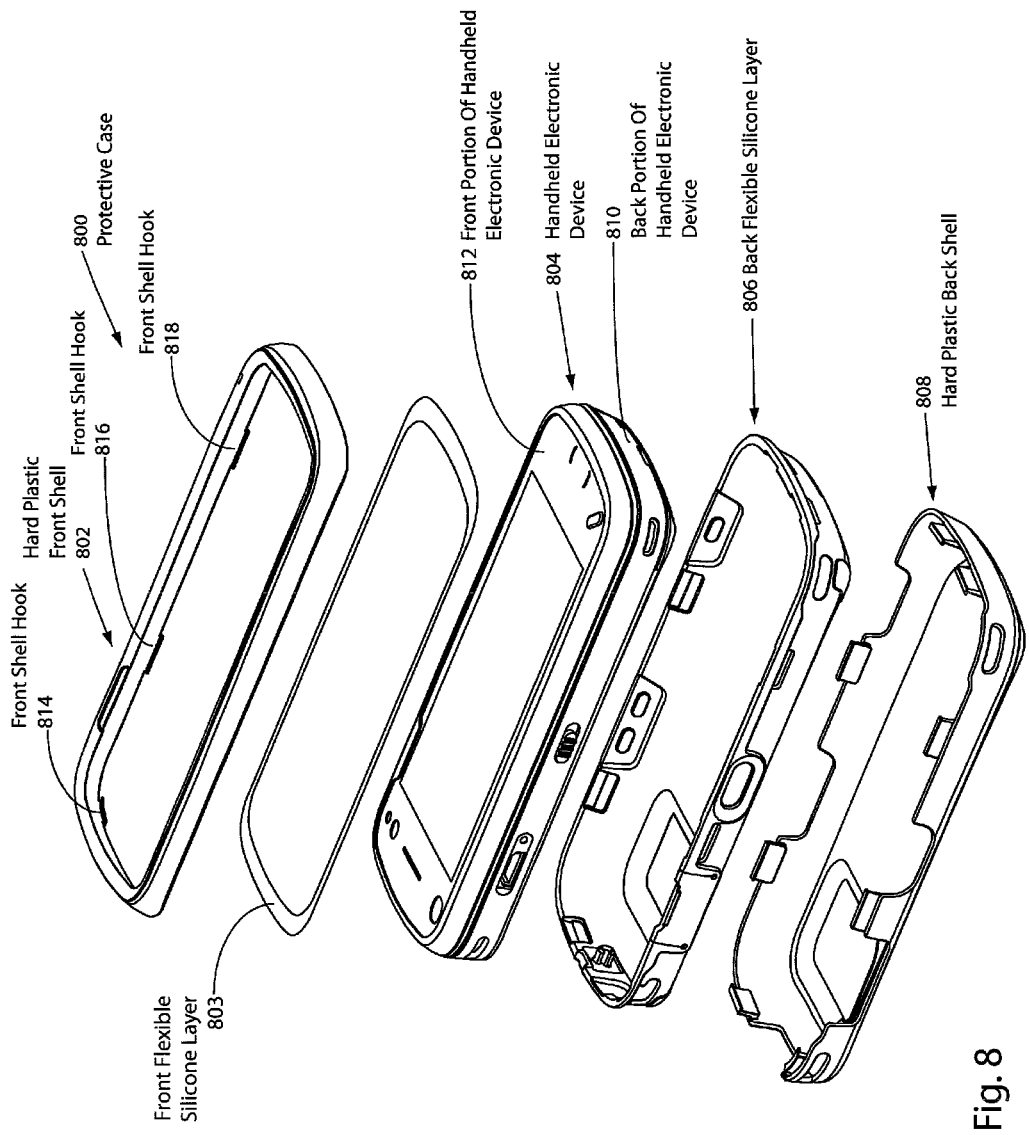
FIG. 8 is an exploded view of another embodiment of a protective case for a sliding/articulating handheld device.

FIG. 8 is an exploded view of another embodiment of a protective case 800 and a sliding/articulating handheld device 804. As illustrated in FIG. 8, a front flexible silicone layer 803 is disposed in hard plastic front shell 802. The combined structure is then attached to the front portion 812 of the handheld electronic device 804 with front shell hooks 814, 816, 818. The back flexible silicone layer 806 is disposed in the hard plastic back shell 808 and attaches to the back portion 810 of the handheld electronic device 804, in the same manner as disclosed with respect to FIG. 1.

The protective case 800 provides additional protection to the front portion 812 of the handheld electronic device 804 as a result of the use of the combined structure of the hard plastic front shell 802 and front flexible silicone layer 803. Hence, a flexible silicone layer is disposed under both the front plastic hard shell 802 and the hard plastic back shell 808 to provide additional protection to both the front portion 812 and the back portion 810 of the handheld electronic device 804.

Figure 9:
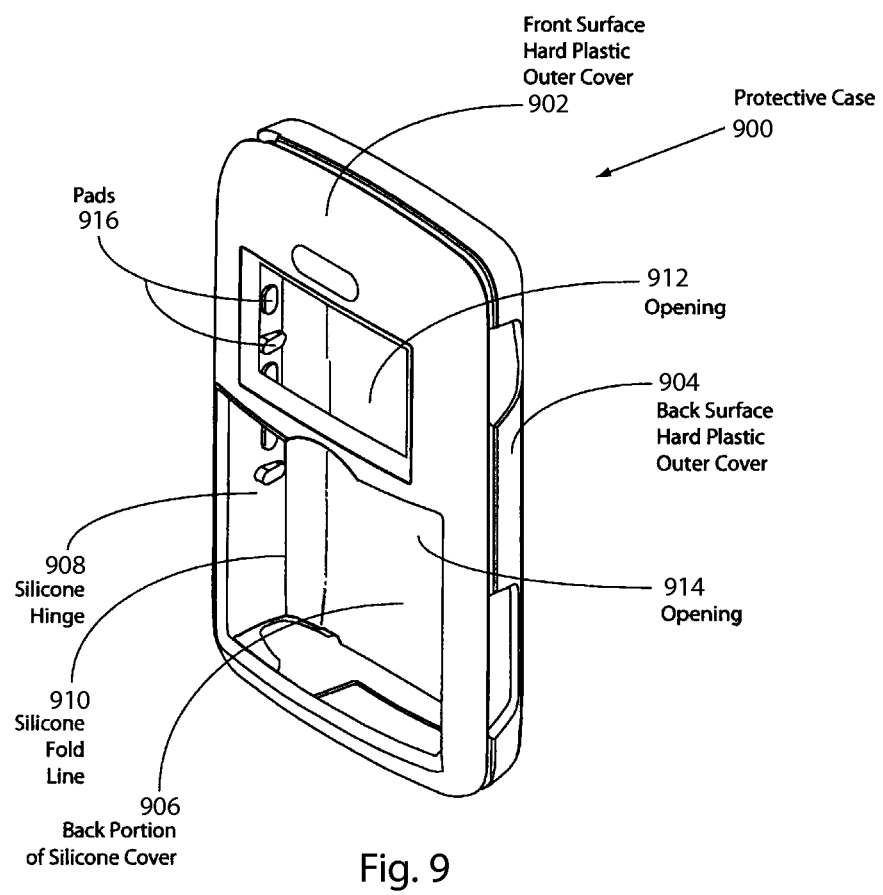
FIG. 9 is a perspective view of an embodiment of a protective case that includes an integrated silicone hinge.

FIG. 9 is a schematic perspective view of an embodiment of a protective case 900 that may be used for a device with a hinge and where the flexible component of the protective case may cover or span the hinge area of the device.

As shown in FIG. 9, the protective cover 900 includes a front surface hard plastic outer cover 902 that snaps onto the front face of a handheld electronic device, such as a mobile phone. Similarly, a back surface hard plastic outer cover 904 snaps onto the back surface of the mobile phone, or other electronic device.

A silicone cover 922, that is soft and flexible, has a front portion 920 that is disposed in the interior portion of the front surface hard plastic outer cover 902 and a back portion 906 that is disposed in back surface hard plastic outer cover 904. A silicone hinge 908, that connects front and back portions of the silicone layer, is disposed between the front surface hard plastic cover 902 and the back surface hard plastic outer cover 904, and hinges along silicone fold line 910.

Figure 10:
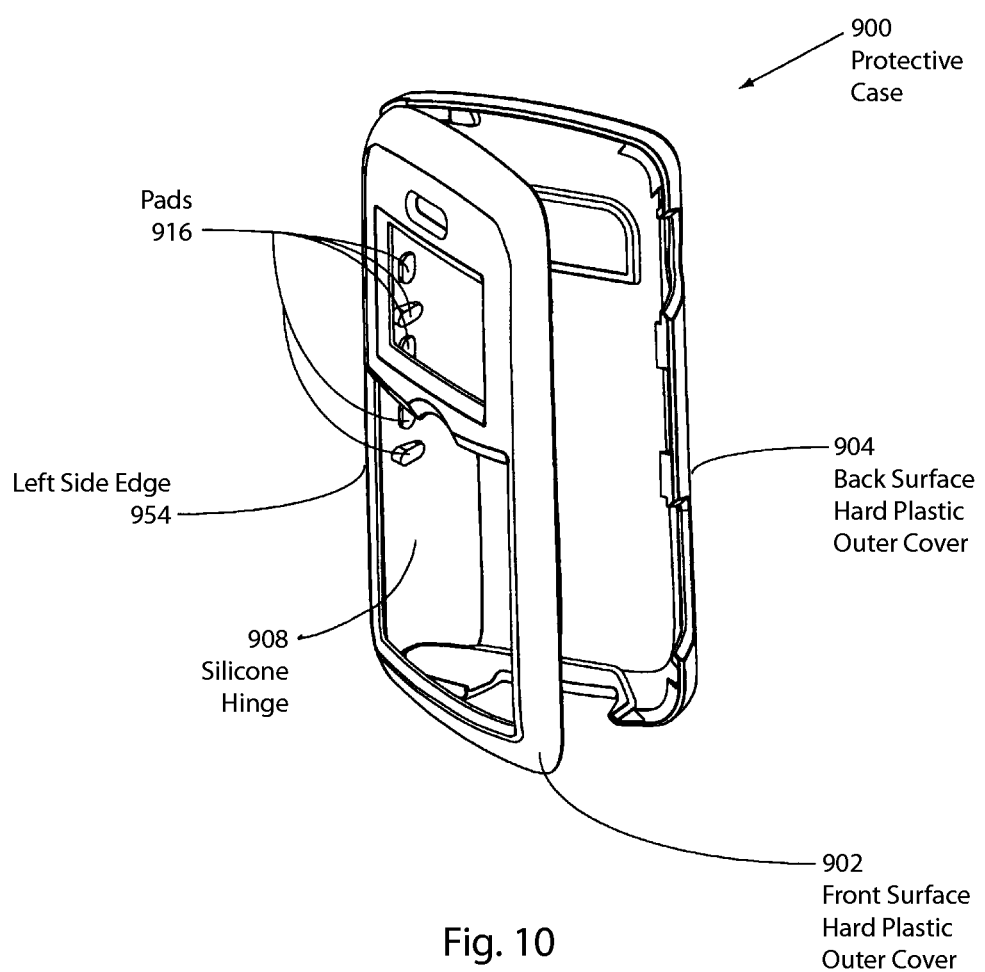
FIG. 10 is a perspective view of the embodiment of FIG. 9 in a partially open position.

FIG. 10 illustrates an example embodiment 900 that shows a protective cover in a partially open position. The protective cover may come in three parts: a front hard plastic cover 902, a back hard plastic cover 904, and a silicone hinge 908.

In some embodiments, the silicone hinge 908 may be a separate, removable piece that is installed first, then the front cover 902 and back cover 904 may be installed on top of the silicone hinge 908.

In other embodiments, the silicone hinge 908 may be molded to one or both of the front cover 902 and back cover 904. In such an embodiment, the silicone hinge 908 may be overmolded onto the back cover 904 and/or the front cover 902. Some embodiments may use a two-shot molding technique or a separate molding operation to mold the silicone hinge 908 onto one or both of the covers.

As shown in FIG. 10, the protective case 900, has a hinge 908 that hinges along a left side edge 954 of the protective case 900. The embodiment 900 may be a protective cover for a cellular telephone or other handheld mobile device. Openings 912, 914, illustrated in FIG. 9, allow a user to view activity and enter information into the electronic device. As also shown in FIG. 9, the silicone hinge 908 may include pads 916 that assist the user in entering information into the side of the handheld electronic device. The silicone hinge 908 provides protection to the left side edge of the handheld electronic device and allows information to be entered into the handheld electronic device through pads 916 on the left side edge 954 of the protective case 900, while the protective case 900 and the handheld electronic device are in a closed position.

In other words, the silicone hinge 908 allows access to buttons on the left side of the handheld electronic device when the handheld electronic device and the protective case 900 are in a closed position, and the silicone hinge 908 provides protection to the side of the handheld electronic device adjacent to the silicone hinge 908. Additionally, the front surface hard plastic outer cover 902 and the back surface hard plastic outer cover 904 provide additional protection from impacts and help disperse impacts throughout the softer silicone layer 922 that is disposed under the hard plastic covers 902, 904.

Figure 11:
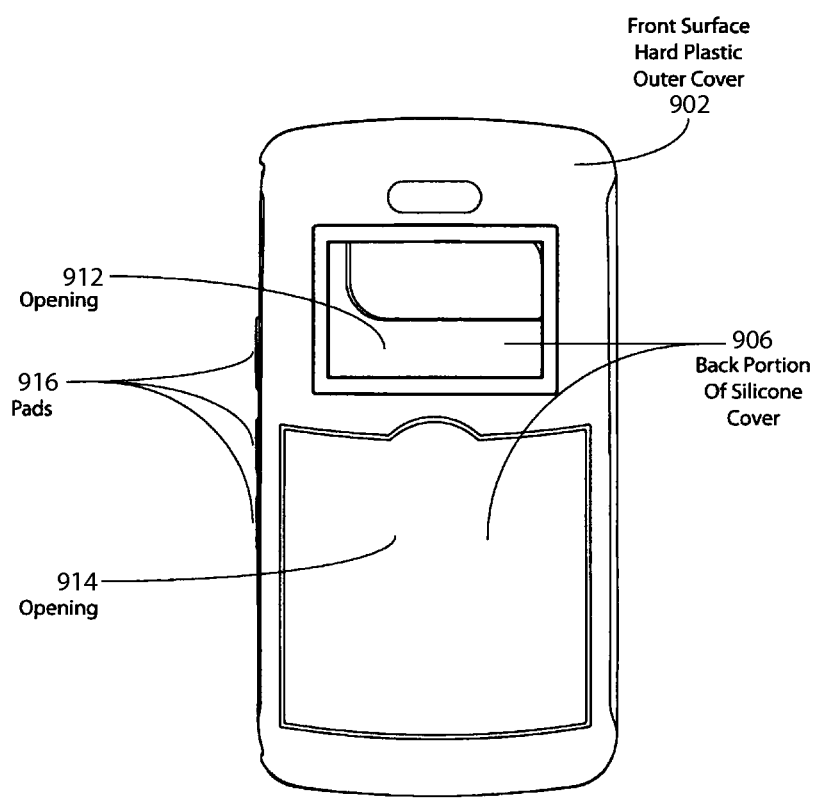
FIG. 11 is a front view of the embodiment of FIG. 9.

FIG. 11 is a front view of the embodiment of FIG. 9. As shown in FIG. 11, the front surface hard plastic outer cover 902 has openings 912, 914. The back portion 906 of the silicone inner cover 922 can be viewed through the openings 912, 914. In addition, pads 916 are shown as part of the silicone hinge 908 that interface with buttons 958 on the handheld electronic device that can be disposed in the protective case 900.

Figure 12:
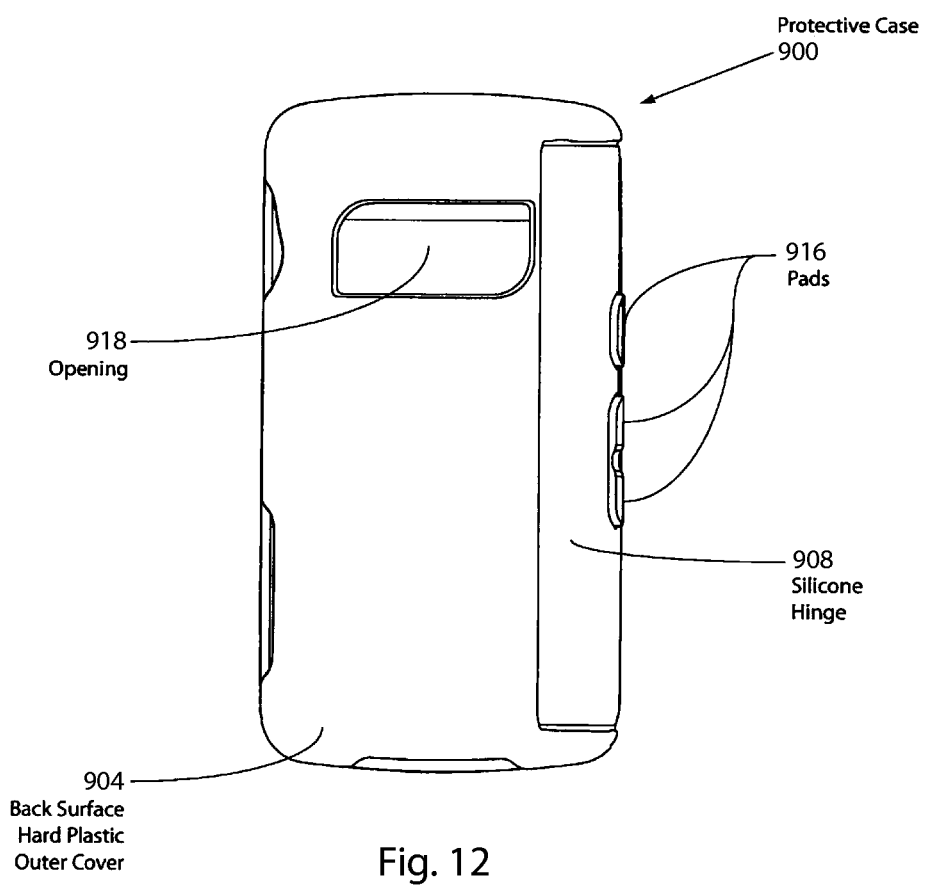
FIG. 12 is a back view of the embodiment of FIG. 9.
Figure 13:
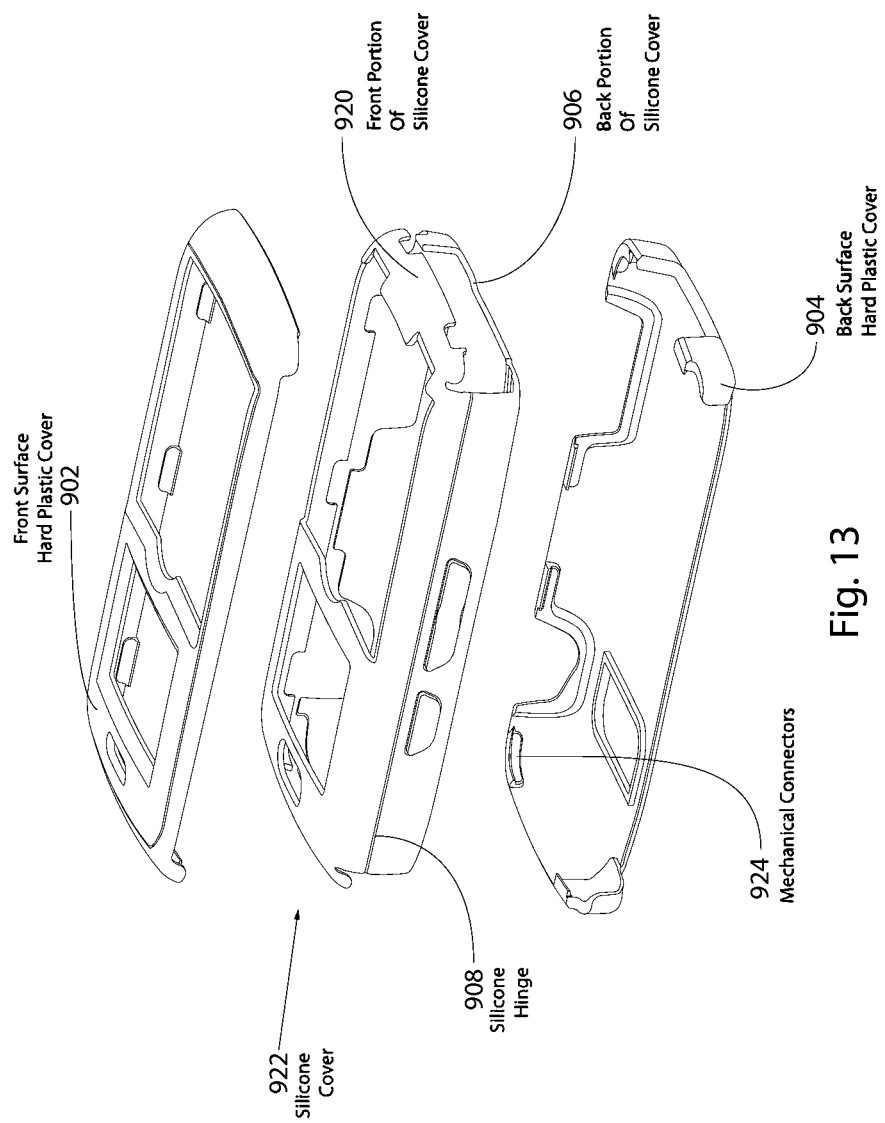
FIG. 13 is an exploded view of the three pieces of the embodiment of FIG. 9.

FIG. 12 is a back view of the protective case 900. As shown in FIG. 12, the back surface hard plastic outer cover 904 has an opening 918. The front portion 920 of the silicone inner cover 922 that is disposed in an inner portion of the front surface hard plastic outer cover 902 is visible through the opening 918. As also illustrated in FIG. 13, the back surface hard plastic outer layer 904 covers only a portion of the back surface, so that silicone hinge 908 is partially exposed. In this manner, silicone hinge 908 has a broad area to flex when the protective case 900 is in the open position.

Pads 916 allow activation of buttons on the enclosed handheld electronic device while the protective case 900 is in the closed position. In this manner, the entire side of the enclosed electronic device is protected by the silicone hinge 908, while the pads 916 allow access to the enclosed handheld electronic device.

FIG. 13 is an exploded view of the three pieces of the embodiment of FIG. 9. As shown in FIG. 13, the front surface hard plastic shell 902 is aligned to cover the front portion of the silicone cover 920. The back surface hard plastic cover 904 is aligned to cover the back portion 906 of the silicone cover 922. The silicone hinge 908 connects the front portion 922 to the back portion 906 of the silicone cover 922.

Mechanical connectors 924 illustrate the manner in which the back surface hard plastic cover 904 attaches to the back portion of the handheld electronic device. Similarly, front surface hard plastic shell 902 includes similar mechanical connectors (not shown) that connect the front surface hard plastic shell 902 to the front portion of the handheld electronic device.

As illustrated in FIG. 13, the silicone cover 922 is a continuous cover that is disposed within the front surface hard plastic cover 902 and the back surface hard plastic cover 904, and extends around the side of the handheld electronic device to provide protection to the front, back and side portions of the handheld electronic device. In this manner, protection is not only provided to the front and back faces, but also at the location where the handheld electronic device hinges with a continuous silicone cover 922.

As disclosed above, the connecting silicone hinge 908 includes pads 916 (FIG. 9) that allow activation of buttons on the handheld electronic device, while the protective case 900 is in a closed position. In this manner, the silicone cover 922 provides protection to the handheld electronic device and allows activation of buttons in the hinge area of the handheld electronic device. Further, the combination of the hard plastic covers 902, 904 that surround the softer silicone cover 922 provides a substantial amount of protection to the handheld electronic device that is not available from either the use of just a silicone cover or hard plastic covers.

The hard plastic covers 902, 904 protect the handheld electronic device from sharp impacts. The shock of hard impacts is spread along the surface of the hard plastic outer covers 902, 904, and is absorbed by the silicone cover 922. In this manner, the combination of the hard plastic covers 902, 904 and the silicone cover 922 provides both protection and accessibility that has not been available to hinged type of handheld electronic devices, such as flip phones.

Although the embodiment 900 is shown as a handheld electronic device that pivots along a side portion, a silicone hinge can also be provided on a top portion of a protective cover for handheld electronic devices that hinge along a top portion. Further, a silicone hinge can be provided along a bottom portion of the protective cover for handheld electronic devices that hinge along a bottom portion. Of course, the silicone hinge can be employed on either side of the protective cover, depending upon which side the electronic device hinges.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A protective case for a handheld electronic device, said handheld electronic device comprising a front portion that slides away from a back portion of the handheld electronic device to expose a keyboard, the protective case comprising:
   a hard plastic front shell that is configured to attach to said front portion of said handheld electronic device with a plurality of front shell hooks that engage said front portion of said handheld electronic device, wherein the front shell hooks do not interfere with a sliding motion of the front portion of the handheld electronic device relative to the back portion of the handheld electronic device when transitioning the handheld electronic device between a closed position and an open position;
   a hard plastic back shell that is configured to attach to said back portion of said handheld electronic device with a plurality of back shell hooks that are recessed from an outer edge of said hard plastic back shell, said hard plastic back shell having a plurality of back shell openings formed along the outer edge of said hard plastic back shell that provide access to electronic device operational features of said handheld electronic device, wherein the back shell hooks do not interfere with a sliding motion of the front portion of the handheld electronic device relative to the back portion of the handheld electronic device when transitioning the handheld electronic device between said closed position and said open position; and
   a flexible silicone layer that is disposed in, and substantially conforms to, said hard plastic back shell, said flexible silicone layer having a plurality of silicone layer openings that engage said plurality of back shell hooks so that said back shell hooks extend through said silicone layer openings in said flexible silicone layer, said flexible silicone layer disposed in said hard plastic back shell so that silicone layer operational features are disposed in said plurality of back shell openings that provide interaction with said electronic device operational features, when said protective case is installed on said handheld electronic device.

2. The protective case of claim 1 wherein:
said silicone layer operational features comprise pads; and
said electronic device operational features comprise buttons on said electronic device.

3. The protective case of claim 2 wherein:
said silicone layer operational features further comprise at least one pivoting access panel; and
said electronic device operational features comprise at least one electronic device port in said handheld electronic device.

4. The protective case of claim 3, wherein said flexible silicone layer further comprises:
recessed portions formed in said silicone layer adjacent to said silicone layer openings, wherein the recessed portions are configured to engage said back shell hooks.

5. A protective cover for a handheld electronic device comprising a front portion and a back portion that are rotatably connected with a hinge along an edge portion of said handheld electronic device, the protective cover comprising:
a front surface hard plastic cover that is configured to attach to said front portion of said handheld electronic device with a first plurality of hooks that engage said front portion of said handheld electronic device, wherein said front surface hard plastic cover is configured to remain securely attached to said front portion of said handheld electronic device when said handheld electronic device transitions from a closed position to an open position;
a back surface hard plastic cover that is configured to attach to said back portion of said handheld electronic device with a second plurality of hooks that engage said back portion of said handheld electronic device, wherein said back surface hard plastic cover is configured to remain securely attached to said back portion of said handheld electronic device when said handheld electronic device transitions from said closed position to said open position; and
a flexible silicone cover comprising:
a front portion that is disposed between said handheld electronic device and said front surface hard plastic cover when said protective cover is installed on said handheld electronic device;
a back portion that is disposed between said handheld electronic device and said back surface hard plastic cover when said protective cover is installed on said handheld electronic device; and
a silicone hinge portion that connects said front portion of said flexible silicone cover to said back portion of said flexible silicone cover, wherein said silicone hinge is disposed over said edge portion of said handheld electronic device, and wherein said silicone hinge covers and protects said edge portion of said handheld electronic device when said protective cover is installed on said handheld electronic device.

6. The protective cover of claim 5 further comprising: pads disposed on said silicone hinge portion that are configured to interface with buttons on said edge portion of said handheld electronic device so that said buttons can be activated through said flexible silicone cover while said silicone hinge portion protects said edge portion of said handheld electronic device.

7. The protective cover of claim 5 wherein said front portion and said back portion of said handheld electronic device are rotatably connected with a hinge along a side edge portion of said handheld electronic device.

8. The protective cover of claim 5 wherein said front portion and said back portion of said handheld electronic device are rotatably connected with a hinge along a top edge portion of said handheld electronic device.

9. The protective cover of claim 5 wherein said front portion and said back portion of said handheld electronic device are rotatably connected with a hinge along a bottom edge portion of said handheld electronic device.

10. The protective cover of claim 5 wherein at least one of the first and the second plurality of hooks comprises mechanical clips.

\* \* \* \* \*